United States Patent [19]
Krusell et al.

[11] Patent Number: 5,304,398
[45] Date of Patent: Apr. 19, 1994

[54] CHEMICAL VAPOR DEPOSITION OF SILICON DIOXIDE USING HEXAMETHYLDISILAZANE

[75] Inventors: Wilbur C. Krusell, San Jose; James P. Garcia; Daniel M. Dobkin, both of Sunnyvale; Frederick F. Walker, Ben Lomond; Jose F. Casillas, San Jose, all of Calif.

[73] Assignee: Watkins Johnson Company, Palo Alto, Calif.

[21] Appl. No.: 71,516

[22] Filed: Jun. 3, 1993

[51] Int. Cl.⁵ ............................................. C23C 16/00
[52] U.S. Cl. ............................. 427/255.3; 427/255.1; 427/255.2; 427/255; 427/248.1; 427/314
[58] Field of Search ............... 427/255.3, 255.2, 255.1, 427/255, 248.1, 314; 437/238

[56] References Cited

U.S. PATENT DOCUMENTS 4,753,855  6/1988  Haluska et al. ..................... 428/702
4,834,020  5/1989  Bartholomew et al. ............. 118/719

FOREIGN PATENT DOCUMENTS 1-25535   1/1989  Japan.
4-80365   3/1992  Japan.
4-246175  9/1992  Japan.

OTHER PUBLICATIONS

"Improved Atmospheric-Pressure Chemical-Vapor-Deposition System for Depositing Silica and Phosphosilicate Glass Thin Films"; L. W. Winkle et al.; Solid State Technology, Oct., 1981, pp. 1–6.

"Advanced APCVD Reactors For Thin Film Deposition"; N. M. Gralenski; Microelectronic Mfg. & Testing, Sep. 1987; pp. 27–28 & 11–12.

"Advanced APCVD Reactors For Thin Film Deposition"; N. M. Gralenski; Microelectronic Mfg. & Testing, Sep./Oct., 1987; pp. 2–8 Lake Publishing Corporation, Libertyville, Ill. 60048.

"Nitrogen Contained HMDS (hexametyldisilazane) $SiO_2$ CVD For Advanced Multi Level Interconnection"; Tsukasa Doi et al.; VMIC Conference; Jun. 8&9, 1993; pp. 84–88.

Primary Examiner—Roy V. King
Attorney, Agent, or Firm—Flehr, Hohbach, Test, Albritton & Herbert

[57] ABSTRACT

A method for depositing silicon dioxide on the surface of a substrate or the like using a nitrogen-containing precursor is disclosed herein. In a preferred implementation the deposition is performed using an atmospheric pressure reactor, into which is directed toward the substrate surface a stream of source gas comprised of ozonated oxygen. A stream of a nitrogen-containing precursor such as, for example, hexamethyldisilazane (HMDS) is also directed into the reactor toward the substrate surface. In addition, a stream of a nitrogen-containing separator gas is directed into the reactor between the streams of precursor and source gases. The inventive deposition method has been shown to result in improved film nucleation on a variety of substrate surfaces.

5 Claims, 5 Drawing Sheets

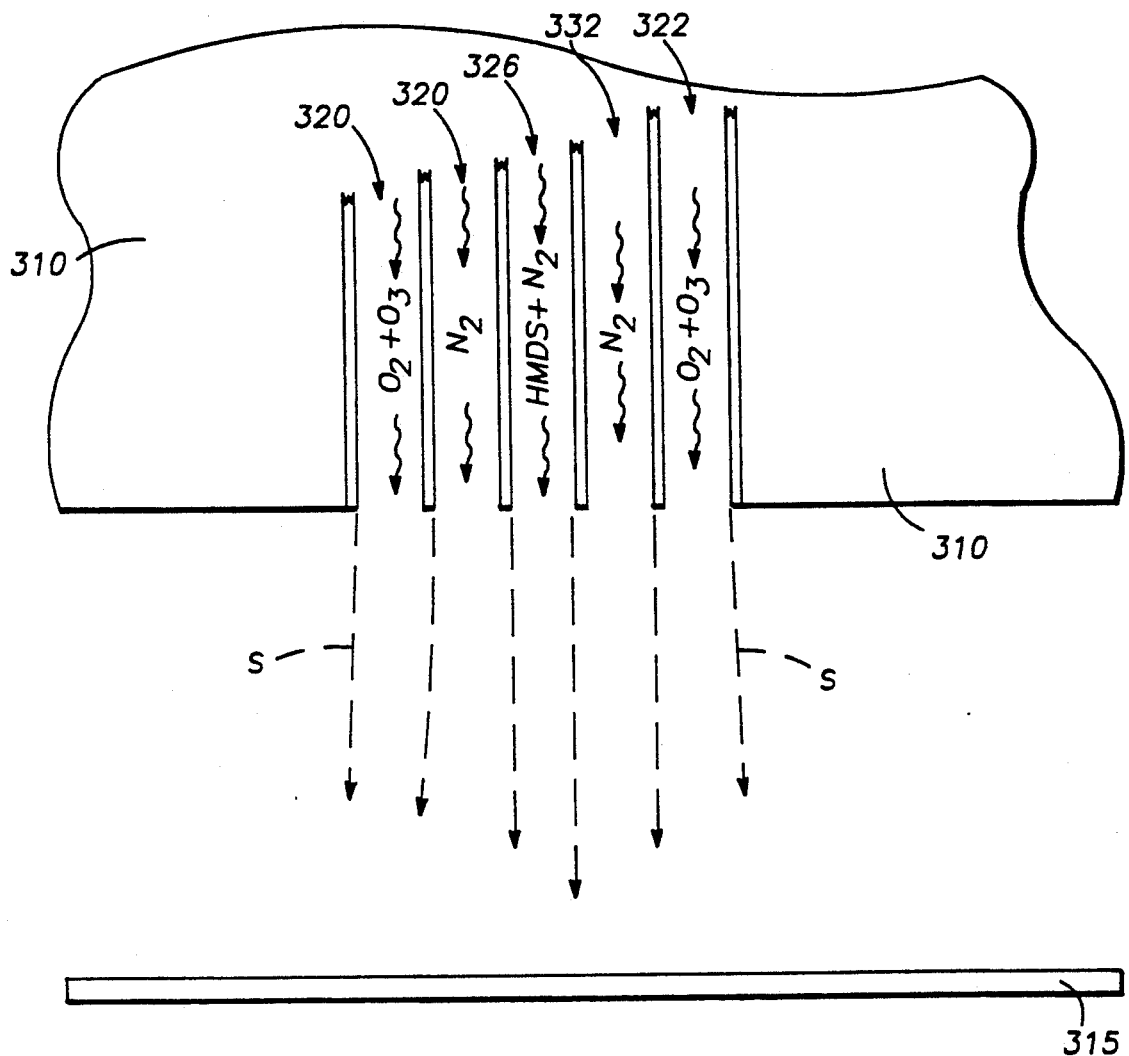
FIG.—4

CHEMICAL VAPOR DEPOSITION OF SILICON DIOXIDE USING HEXAMETHYLDISILAZANE

This invention relates generally to chemical vapor deposition of films on the surfaces of substrates or wafers, and more particularly to the deposition of silicon dioxide on such surfaces.

BACKGROUND OF THE INVENTION

Chemical vapor deposition of silicon dioxide films has been employed in semiconductor fabrication for several years. Such films have been produced by using, for example, conveyorized atmospheric pressure chemical vapor deposition (APCVD) apparatus. An exemplary APCVD device is disclosed in U.S. Pat. No. 4,834,020, entitled "Atmospheric Chemical Vapor Deposition Apparatus", which is assigned to the assignee of the present invention, and which is herein incorporated by reference.

In the early development of silicon dioxide films silane and oxygen were often used as source gases. Unfortunately, the use of particular deposition precursors in these initial efforts tended to impede film conformance to various types of surface features. Organosilane precursors such as tetraethylorthosilicate (TEOS) have since been used to improve surface conformity, but have generally required relatively high deposition temperatures.

In recently developed techniques, ozonated oxygen has been employed as a source gas with TEOS and other organosilane precursors in order to obtain deposition of silicon dioxide at reduced temperatures (300°–500° C.). As is known, the use of ozonated oxygen allows deposition to be initiated at low temperatures without requiring plasma excitation. Films created using these recently developed techniques have generally exhibited improved topographical conformance, thereby enabling the production of films with smooth surfaces. However, such films often do not readily grow upon commonly encountered surfaces such as thermal silicon dioxide or fluorine-contaminated metals. Such inhibition of nucleation can result in reduced deposition rates and increased film porosity.

OBJECTS OF THE INVENTION

Accordingly, it is an object of the present invention to provide a method for the low-temperature deposition, in the absence of plasma excitation, of silicon dioxide films resulting in improved film nucleation on surfaces typically encountered during semiconductor device fabrication.

SUMMARY OF THE INVENTION

In summary, the present invention comprises a method for depositing silicon dioxide on the surface of a substrate or the like using a nitrogen-containing precursor. In a preferred implementation the deposition is performed using an atmospheric pressure reactor, into which is directed toward the substrate surface a stream of source gas comprised of ozonated oxygen. A stream of a nitrogen-containing precursor such as, for example, hexamethyldisilazane (HMDS) is also directed into the reactor toward the substrate surface. In addition, a stream of a nitrogen-containing separator gas is introduced between the streams of precursor and source gases. The inventive deposition method has been shown to result in improved film nucleation on a variety of substrate surfaces.

In an exemplary embodiment, HMDS was used as a precursor in producing silicon dioxide films at temperatures between 340° and 500° C. In contrast to films produced using conventional precursors, the rate of film deposition when HMDS is used as a precursor has been found to be relatively insensitive to the surface texture of the substrate.

BRIEF DESCRIPTION OF THE DRAWINGS

Additional objects and features of the invention will be more readily apparent from the following detailed description and appended claims when taken in conjunction with the drawings, in which:

FIG. 4 shows a magnified view of a gas injection assembly included within the reaction chamber of FIG. 3.

DESCRIPTION OF THE PREFERRED EMBODIMENT

As will be described hereinafter, the present invention contemplates using a nitrogen-containing precursor, such as hexamethyldisilazane (HMDS), in the deposition of silicon dioxide. Deposition is initiated at low temperatures, in the absence of plasma excitation, through use of a source gas comprised of ozonated oxygen. It is believed that the high concentration of silicon dioxide in the resultant films, and the relative absence therein of nitrogen-containing compounds such as silicon nitride or silicon oxynitride, is due to the strength of the silicon-oxygen bond relative to the Si—N bond. The disclosed deposition technique may be safely incorporated into existing semiconductor processing systems given the reactive stability and wide availability of HMDS.

Films have been deposited using both a low-pressure single-wafer reactor, as well as using a conveyorized-belt atmospheric pressure reactor of the type described in, for example, the above-referenced U.S. Pat. No. 4,834,020. A brief description of each type of reactor is provided to facilitate description of the invention.

Figure 1:
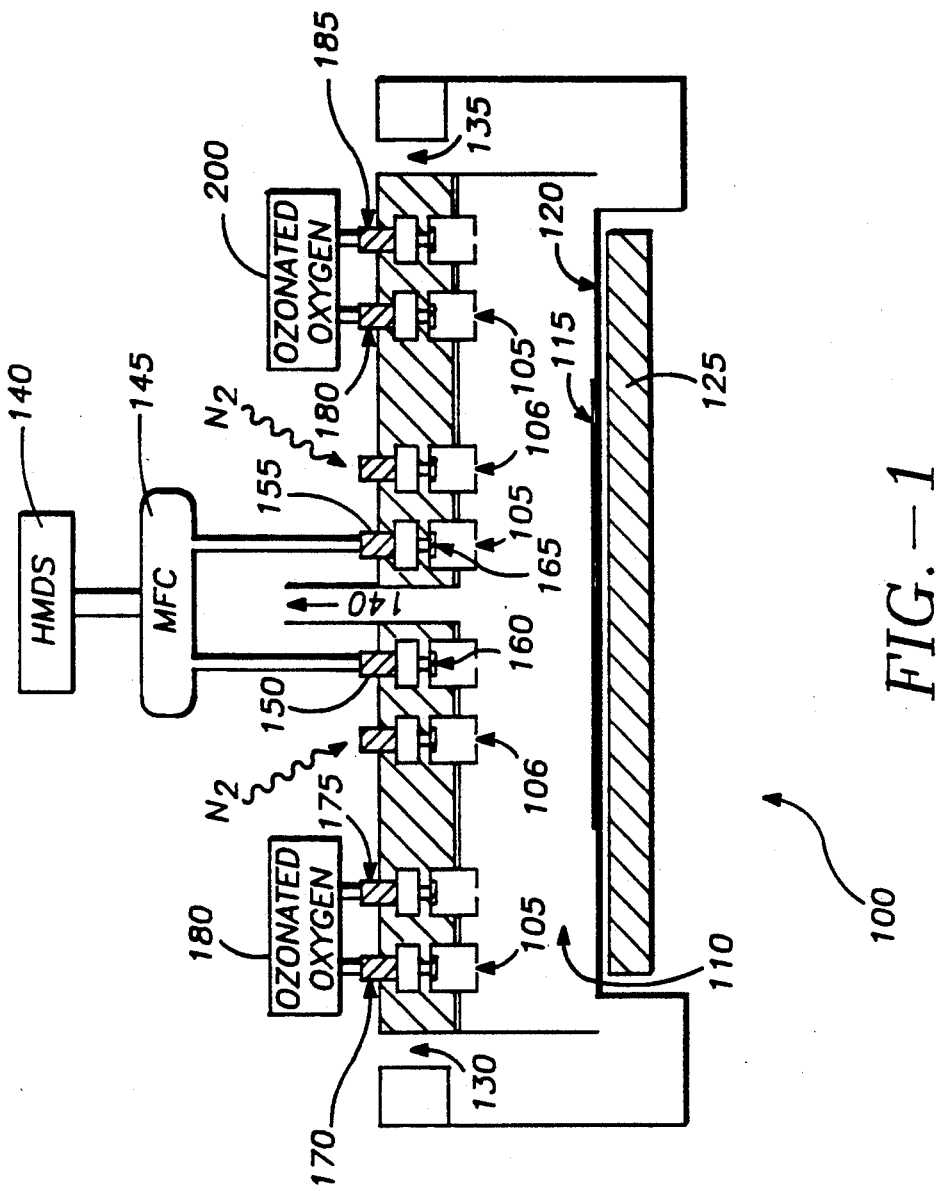
FIG. 1 shows a cross-sectional view of an exemplary low-pressure, single-wafer deposition reactor which may be used to implement the deposition technique of the invention.

FIG. 1 shows a cross-sectional view of an exemplary single-wafer reactor 100. The reactor 100 includes a plurality of dispensing ports 105, 106 through which gas is dispensed into reaction chamber 110. The semiconductor wafer or substrate 115 upon which a film is to be deposited is mounted on a quartz cover 120 within the deposition chamber 110, and is heated through both radiation and conduction from a boron nitride-encapsulated, 3-zone graphite heater 125. A mechanical pump and blower apparatus (not shown) connected to peripheral exhaust ports 130 and 135 are employed in combination with a center exhaust port 140 to evacuate the chamber 110 to a pressure of several mTorr. The temperature of the wafer 115 is estimated by immersing, in a temperature environment substantially identical to that maintained within the chamber 110, a thermocouple-instrumented reference wafer of the same composition as wafer 115. A reference wafer of this type is available from, for example, the Sensarray Corporation of Santa Clara, Calif.

The substantial vapor pressure of HMDS at room temperature allows it to be directed into the chamber 110 during the deposition process using a relatively simple gas-metering scheme. Specifically, a quartz reservoir 140 containing HMDS is connected by way of a low-pressure calibrated mass flow controller (MFC) 145 to gas inlets 150 and 155. Blocking screws 160 and 165 are placed in an open position during injection of HMDS into the chamber 110. In a preferred implementation the volume of chamber 110 is determined by first sealing the exhaust ports 130, 135 and 140, injecting HMDS into the chamber 110 at a predetermined flow rate, and measuring the accompanying increase in pressure. Such a volumetric calibration will generally be necessary in order to verify calibration of the mass flow controller 145. The reservoir 140 will preferably be filled with a spectroscopic-grade HMDS precursor obtainable from, for example, the Hüls America Corp. of Piscataway, N.J.

Referring to FIG. 1, a pressurized source gas comprised of ozonated oxygen is supplied to a first pair of peripheral inlet ports 170 and 175 from a first gas-dispensing apparatus 180, and to a second pair of peripheral inlet ports 185 and 190 from a second gas-dispensing apparatus 200. Each of the dispensing apparatus 180 and 200 will preferably include a conventional high-voltage discharge generator. The discharge generators are used in creating ozonated oxygen from a supply of pure oxygen provided to the apparatus 180 and 200. In the preferred implementation ozone concentration is monitored using an ultraviolet-absorption ozone concentration monitor available from, for example, the Anseros Corporation (Germany). In the pressurized reactor of FIG. 1, the injected gaseous streams of ozonated oxygen and HMDS are separated by a stream of nitrogen injected into the chamber 110 through the dispensing ports 106.

Figure 2:
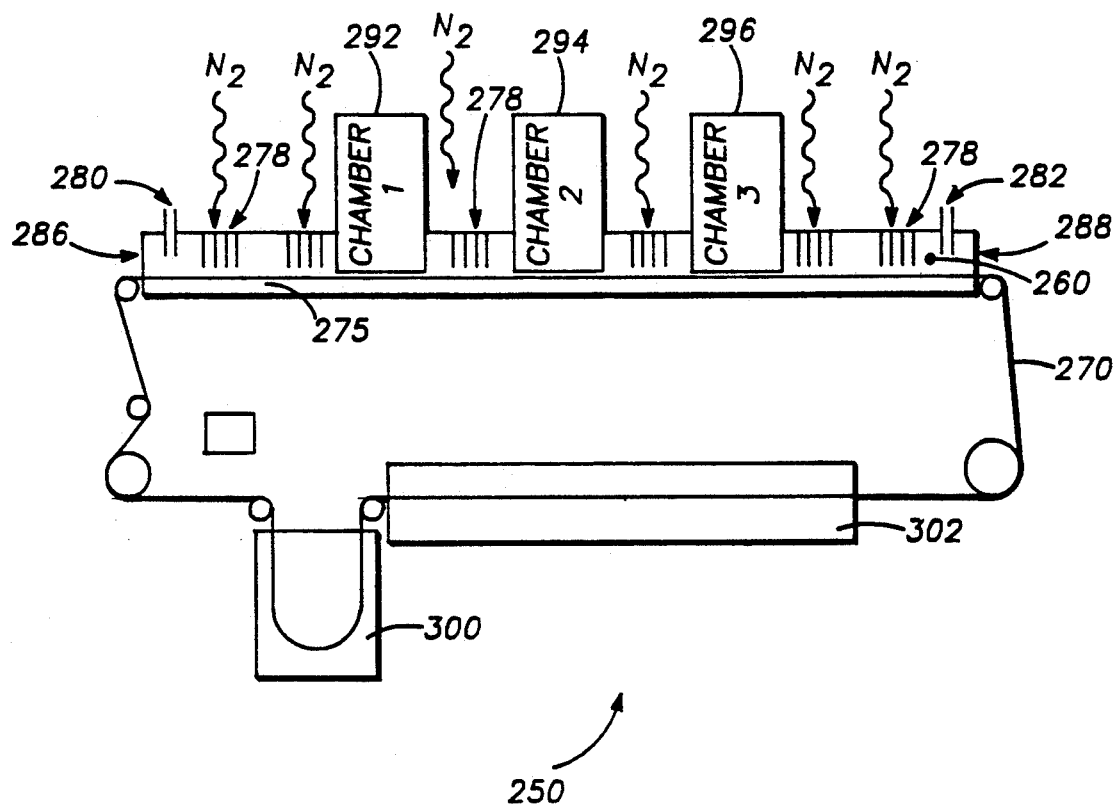
FIG. 2 shows a side view of a conveyorized-belt atmospheric pressure reactor also capable of implementing the deposition technique of the invention.

Referring to FIG. 2, there is shown a side view of a conveyorized-belt atmospheric pressure reactor 250 capable of implementing the deposition technique of the invention. The reactor 250 includes a resistively-heated box 260 of Iconel alloy. A woven conveyor belt 270 for transporting wafers or substrates through first, second and third reaction chambers 292, 294 and 296 rests on the floor 275 of the box 260. The heated box 260 includes a plurality of vents 278 disposed to admit pressurized nitrogen gas. This flow of pressurized nitrogen is allowed to escape through a pair of nitrogen exhaust ports 280 and 282 located proximate open ends 286 and 288 of the heated box 260, thereby preventing entry of ambient air into the box 260. The belt 275 is rinsed and etched within a rinse tank 300 and belt vapor etcher 302, respectively, in order to remove film deposited thereon within the reaction chambers 292, 294 and 296.

Figure 3:
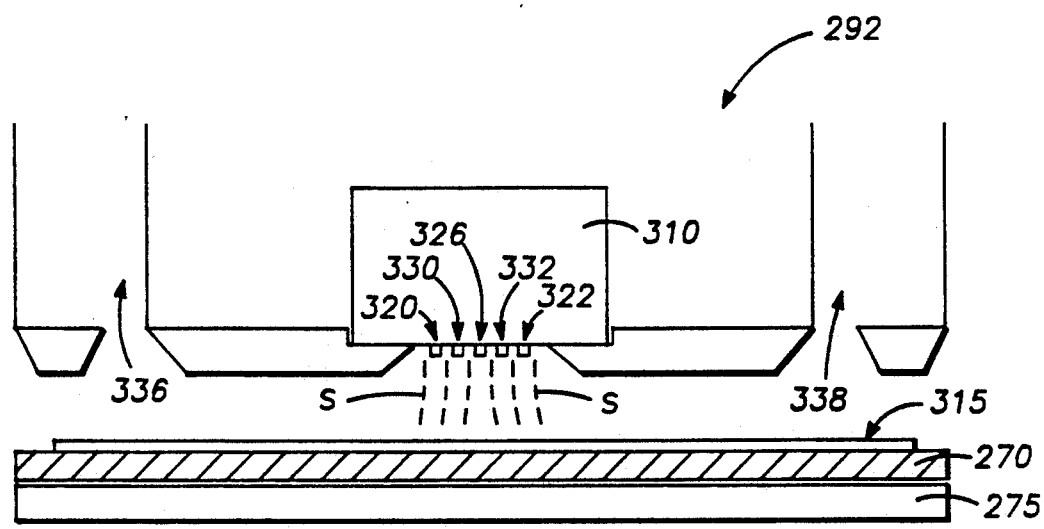
FIG. 3 provides a side cross-sectional view of the interior of a reaction chamber included within the atmospheric pressure reactor of FIG. 2.

FIG. 3 provides a side cross-sectional view of the interior of the first reaction chamber 292, it being understood that the second and third reaction chambers 294 and 296 are substantially identical thereto. The reaction chamber 292 includes a gas injection assembly 310 mounted above the upper surface of a wafer 315 carried by the belt 270. The injection assembly 310 includes a pair of outer dispensing ports 320, 322 for dispersing the source gas of ozonated oxygen in the direction of the wafer 315. Similarly, the HMDS precursor diluted with nitrogen is injected into chamber 292 through a center dispensing port 326 of the injection assembly. In addition, a stream of pressurized nitrogen gas is injected between the center port 326 and the outer ports 320, 322 through a pair of separator ports 330, 332. In this way the injection assembly 310 produces five thin sheaths of gas, the streamlines S of which are indicated in FIG. 3.

As is also shown in FIG. 3, first and second exhaust passages 336 and 338 are provided at either end of the reaction chamber 292. As is well-known, the temperature within the reaction chamber 292 may be controlled through appropriate heating of the box 260. The speed of the transport belt 270 and the gas flow rates through the injection assembly 310 may also be varied as desired.

Referring to FIG. 4, there is shown a magnified view of the injection ports of the injection assembly 310. The mixture of HMDS and nitrogen dispensed by injection port 326 was produced by a conventional temperature-controlled nitrogen bubbler (not shown) in gaseous communication with the reservoir 140 (FIG. 1). Gas flow from port 326 may be estimated using the Clausius-Clapeyron equation, from which is obtained the vapor pressure of HMDS after substitution therein of values for the boiling point and enthalpy of vaporization of the liquid. The flow rates from the remaining dispensing ports 320, 322, 330, 332 may be controlled using conventional gas metering schemes.

As is described below, a set of depositions have been performed at atmospheric pressure using the conveyorized-belt reactor 250. In general, heater settings were adjusted to produce a wafer temperature of approximately 400° C. beneath the gas injector. The nominal flow rates of HMDS and ozonated oxygen were set at 4.5 and 9.5 slpm, respectively. Depositions were performed on 150 mm silicon (Si) wafers of varying surface texture. The thickness of the films deposited directly on the silicon surface was measured with a Prometrix SM200 scanning reflectometer, while the thickness of films deposited on polysilicon or metallic surfaces of the wafers were was estimated from cross-sectional scanning electron micrographs. In addition, refractive index was measured using an ellipsometer produced by Rudolph Research of Flanders, N.J.

In addition to thickness, the wet etch rate and stress characteristics of the film depositions were also measured. Wet etch rate was measured via the decrease in thickness upon a single immersion in 10:1 HF for 20–40 seconds at room temperature. Stress was obtained from the change in wafer curvature as measured by a stress measurement system obtained from the Tencor Corporation of Mountain View, Cailf. In order to prevent the formation of artifacts due to extended exposure to ambient air, samples were stored in a nitrogen-purged glove box within one hour of deposition.

Figure 5:
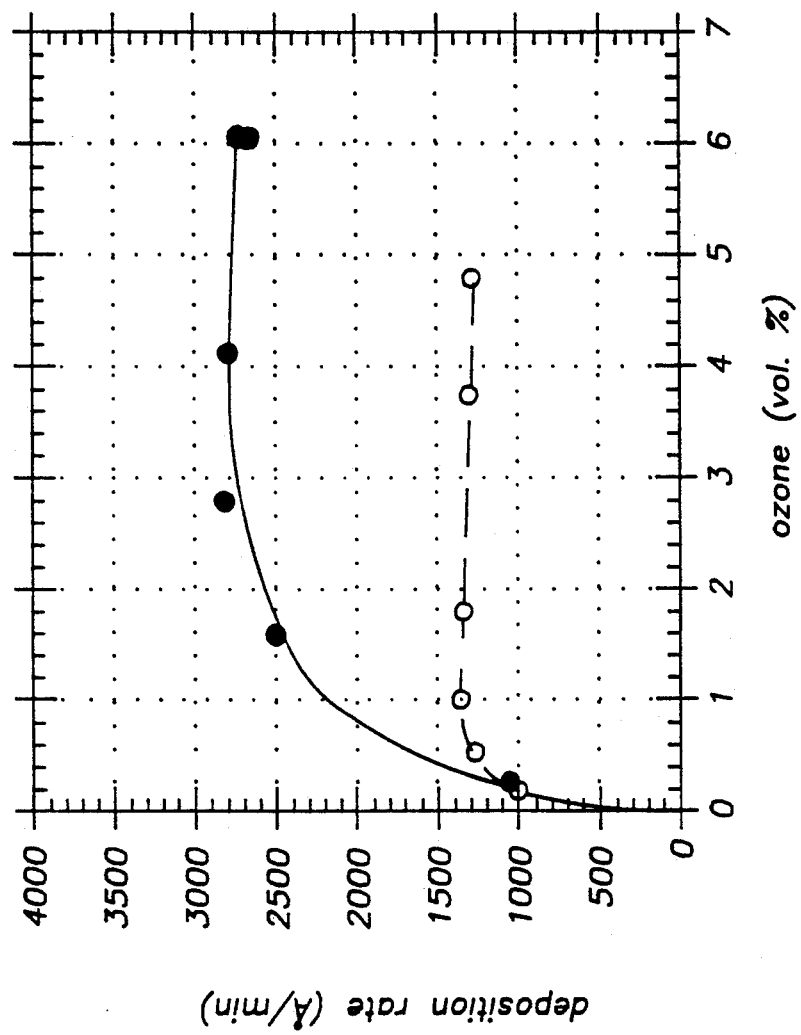
FIG. 5 provides a graphical representation of the deposition rate of silicon dioxide film as a function of the concentration of ozone within the flows of ozonated oxygen injected into the reaction chamber.

Initially, the variation in deposition rate as a function of ozone concentration in the oxygen flows from ports 320 and 322 was investigated. Gas flow from the separator ports 330 and 332 was fixed at 12 slpm, and temperature was maintained at 400° C. Referring to FIG. 5, deposition rate (Å/min) is graphically represented (solid line) with respect to volumetric ozone concentration within the flows of ozonated oxygen. Also shown for purposes of comparison (dashed line) is the deposition rate obtained by using TEOS, rather than HMDS, as a deposition precursor.

As is indicated by the solid line in FIG. 5, deposition rate increases rapidly as a function of ozone concentration for ozone concentrations less than approximately 3% by volume, and decreases slightly thereafter. Based upon the results of FIG. 5, there was compiled the three-factor experimetnal matrix set forth below.

TABLE 1

| | Ozone (mole %) | Separator (lpm) | HMDS (sccm) | T (°C.) |
|---|---|---|---|---|
| set 1: | | | | |
| min | 5 | 9 | 10 | 400 |
| max | 7 | 15 | 20 | 400 |
| set 2: | | | | |
| min | 4 | 9 | 10 | 400 |
| max | 6.5 | 15 | 20 | 400 |
| set 3: | | | | |
| min | 4 | 9 | 10 | 500 |
| max | 6.5 | 15 | 20 | 500 |

Referring to TABLE I, the flows of HMDS, the nitrogen separator gas, and ozonated oxygen were varied over the specified ranges. A first set (set 1) of depositions was conducted at a transport belt speed of 4.25 cm./min, and a second set (set 2) at a belt speed of 2.5 cm./min over a slightly wider range of ozone concentration. Close agreement was found to exist between the rates of deposition measured for each set. In addition, measurements of refractive index varied over the range $1.46 \pm 0.03$, indicating only minimal incorporation of nitrogen into the deposited film.

Figure 6:
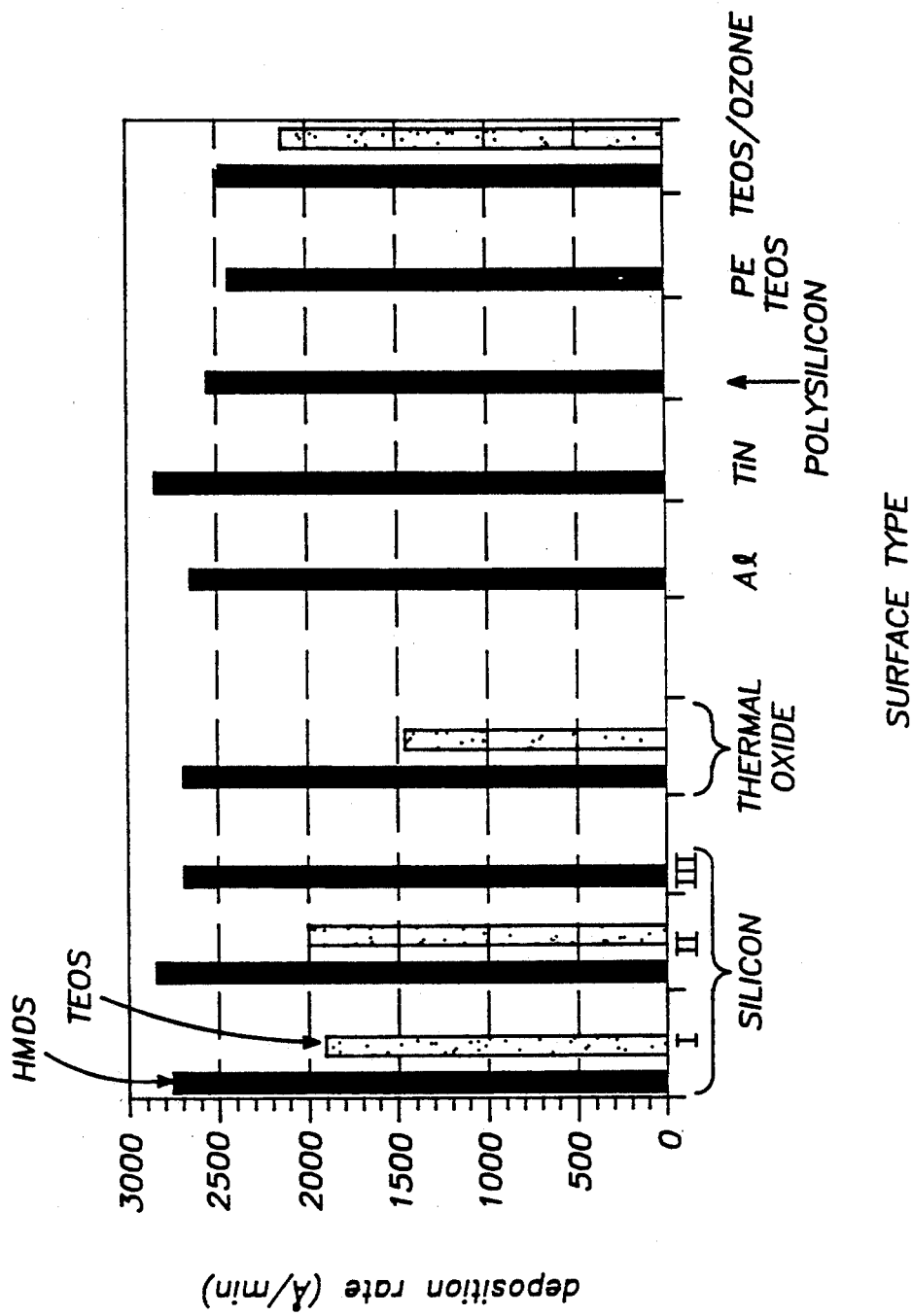
FIG. 6 graphically depicts the deposition rates of silicon dioxide over a variety of surfaces for depositions performed using precursors of hexamethyldisilazane (HMDS) and of TEOS.

FIG. 6 provides a graphical representation of the deposition rate of silicon dioxide for depositions performed using an HMDS precursor, and for purposes of comparison those performed using TEOS as a precursor, for a variety of surface types. Specifically, depositions were performed using:
(i) several (I, II, and III) types of silicon,
(ii) thermal oxide,
(iii) aluminum (Al),
(iv) titanium nitride (TiN),
(v) polysilicon,
(vi) plasma-deposited SiO$_2$ from TEOS and ozone (PE TEOS), and
(vii) thermally-deposited SiO$_2$ from TEOS and ozone (TEOS/ozone).

As is apparent from FIG. 6, deposition rate exhibits less variation with respect to surface type for depositions in which HMDS is employed as a precursor than for depositions using TEOS.

Additional depositions were performed at low pressure using the single-wafer reactor 100 (FIG. 1). Films were deposited on 150 mm silicon substrates with no pretreatment, except as noted below. Total pressure was varied from 1 to 8 Torr, and temperature from 340° to 430° C. The total flow of ozonated oxygen was fixed at 2 standard liters/minute (slpm), with the concentration of ozone in the oxygen being held at 7.5 mole %. The flow of HMDS was fixed at 20 standard cm$^3$/min. (sccm). The resulting deposition rates varied from 100 to 570 Å/min. In depositions over aluminum, films of up to 0.5 μm in thickness were temperature-cycled to 400° C. without exhibiting stress cracks.

As suggested by the following, a nitrogen-containing species provides a more aggressive agent for reaction with surface silanol than a siloxane precursor such as TEOS:

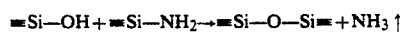

The enhanced reactivity of such a species relative to siloxanes is consistent with the observed ready nucleation on both active and inert surfaces. In addition, the general absence of nitrogen in the deposited films suggests that the reactions go to completion, with all Si—N bonds converted to either silanol or to siloxane.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method for thermal chemical vapor deposition of silicon dioxide on a surface positioned within a reaction chamber, comprising:
   directing into said chamber and toward said surface a first gas stream including ozone and oxygen;
   directing into said chamber and toward said surface a second gas stream including hexamethyldisilazane (HMDS); and
   directing into said chamber and toward said surface a stream of a nitrogen-containing separator gas, said stream of said nitrogen-containing separator gas being introduced into said chamber between said first and second gas streams, said first and second gas streams interacting proximate said surface to deposit a layer of silicon dioxide on said surface.

2. A method for thermal chemical vapor deposition of silicon dioxide on a surface of a semiconductor wafer positioned within a reaction chamber, comprising:
   injecting a first gas stream including ozone and oxygen into said reaction chamber through a first dispensing port;
   injecting a second gas stream including hexamethyldisilazane (HMDS) into said reaction chamber through a second dispensing port; and
   injecting a stream of a nitrogen-containing separator gas into said reaction chamber through a third dispensing port located between said first and second dispensing ports, said first and second gas streams interacting proximate said surface to deposit a layer of silicon dioxide on said surface.

3. The method of claim 2 further including the step of heating said wafer to a temperature between approximately 300 and 500 degrees centigrade.

4. The method of claim 2 further including the step of maintaining a mole percentage of ozone in said first gas of between approximately four and eight.

5. A method for thermal chemical vapor deposition of a layer of silicon dioxide on a surface of a semiconductor wafer using an atmospheric pressure chemical vapor deposition apparatus, said apparatus defining a temperature-controlled reaction chamber in gaseous communication with a plurality of injection ports, comprising the steps of:
   heating said semiconductor wafer within said reaction chamber;

injecting a first gas stream through a first one of said injection ports into said reaction chamber, said first gas stream including ozone and oxygen;

injecting a second gas stream through a second one of said injection ports into said reaction chamber, said second gas stream including hexamethyldisilazane (HMDS);

directing a stream of a nitrogen-containing separator gas through a third one of said injection ports into said reaction chamber, said third injection port being positioned between said first and second injection ports, said first and second gas streams interacting proximate said surface to deposit said layer of silicon dioxide on said surface.

* * * * *